United States Patent [19]
Saitoh et al.

[11] Patent Number: 5,618,345
[45] Date of Patent: Apr. 8, 1997

[54] METHOD OF PRODUCING SELF-SUPPORTING THIN FILM OF SILICON SINGLE CRYSTAL

[75] Inventors: Kazuo Saitoh, Nagoya; Hiroaki Niwa, Ichinomiya; Setsuo Nakao; Soji Miyagawa, both of Nagoya, all of Japan

[73] Assignee: Agency of Industrial Science & Technology, Ministry of International Trade & Industry, Tokyo, Japan

[21] Appl. No.: 403,956

[22] Filed: Mar. 14, 1995

[30] Foreign Application Priority Data

Mar. 18, 1994 [JP] Japan .................................. 6-074487

[51] Int. Cl.[6] .................................................. C30B 33/06
[52] U.S. Cl. ................................. 216/2; 117/2; 438/977; 438/705; 438/702
[58] Field of Search ........................... 117/1, 2, 95, 97; 437/11, 416 S

[56] References Cited

FOREIGN PATENT DOCUMENTS

| | | |
|---|---|---|
| 1004966 | 2/1976 | Japan . |
| 89-55656 | 3/1989 | Japan . |
| 91171671 | 6/1992 | Japan . |

OTHER PUBLICATIONS

Journal of Applied Physics, vol. 72, No. 1, Jul. 1992, Stefan Joksch, et al., "Characterization of Thin, Doped Silicon Single Crystals by X–Ray Diffraction", pp. 54–60.

Physical Review B, vol. 19, No. 1, Jan. 1, 1979, Isamu Nashiyama, "Damage Distributions in Hydrogen–Bombarded Silicon", pp. 101–108.

Review of Scientific Instruments, vol. 51, No. 9, Sep. 1980, N.W. Cheung, "Preparation of Large–Area Monocrystalline Silicon Thin Windows", pp. 1212–1216.

Announcement of Virginia Semiconductor Inc., May 22, 1990, "2–4 Micron Thin Silicon Membranes", 1 page.

*Primary Examiner*—Felisa C. Garrett
*Attorney, Agent, or Firm*—Oblon, Spivak, McClelland, Maier & Neustadt, P.C.

[57] ABSTRACT

A self-supporting thin film of silicon single crystal is produced essentially by the steps of implanting boron ions in a silicon single crystal substrate from one major surface thereof to form a high impurity concentration layer having a high boron concentration in the substrate; heating the silicon single crystal substrate formed with the high impurity concentration layer in an atmosphere containing oxygen to form an oxide film on the surface of the single crystal substrate and make the high impurity concentration layer resistant to etching; masking all of the oxide film surface other than that at the center region on the surface opposite from that implanted with boron ions and then exposing the high impurity concentration layer by high-speed mask etching followed by selective etching; and removing the oxide film.

10 Claims, 3 Drawing Sheets

METHOD OF PRODUCING SELF-SUPPORTING THIN FILM OF SILICON SINGLE CRYSTAL

BACKGROUND OF THE INVENTION

1. Field of the Invention

This invention relates to a method of producing a self-supporting thin film of silicon single crystal of uniform thickness of about 0.5–10 µm for use in the production of electronic devices, various types of sensors, micromachines and the like which utilize silicon semiconductors.

2. Description of the Prior Art

Silicon single crystal self-supporting thin films have conventionally been produced by the following methods.

1) First producing a silicon single crystal thin film of greater than final thickness and then mechanically and/or chemically polishing it to prescribed final thickness (Announcement of VIRGINIA SEMICONDUCTOR, INC., 1990).

2) Using an epitaxial growth technique to produce silicon having multiple layers with different impurity concentrations and then producing a thin self-supporting film by etching the silicon using an etchant whose etching speed varies with impurity concentration (① I. Nashiyama, Phys. Rev. 19 (1979) 101, ② S. Joksch, W. Graeff, P. Zaumseil, U. Winter, L. Csepregi, F. Iberl and A. K. Freund, J. Appl. Phys., 72 (1992) 54).

3) Thermally diffusing boron or the like from the surface of the silicon single crystal into the single crystal to thereby form a diffusion layer including the boron or the like as impurity and then removing the layers other than the diffusion layer by etching (N. W. Cheung, Rev. Sci. Instrum., 51 (1980) 1212).

Each of these methods has drawbacks, however.
Method 1)

Mechanical polishing can reduce the film thickness only to several tens of µm and leaves a scarred surface. While the machining defects can be removed and the thickness be reduced by subsequent chemical polishing, the resulting thin film has very uneven thickness. Film thickness can also be reduced solely by chemical polishing but the resulting thin film is again uneven.
Method 2)

The complexity of the epitaxial growth process makes it difficult to control the film thickness.
Method 3)

Although the method employing thermal diffusion of boron is excellent for producing very thin films with a thickness of 1 µm or less, the resulting film contains impurity (boron) at a high density of $10^{20}$ atoms/cm$^2$. Moreover, since the thickness of the thin film obtained depends on the thickness of the diffusion layer, a thick diffusion layer has to be formed for obtaining a thin film but when this is done it becomes impossible to obtain a good quality single crystal because the number of crystalline lattice disorder is increased by dislocations and the like.

A strong need therefore exists for a silicon single crystal self-supporting thin film which has uniform thickness and enables easy control of film thickness and impurity concentration. The inventors accomplished the present invention through research aimed at meeting this need.

SUMMARY OF THE INVENTION

Specifically, this invention provides a method of producing a self-supporting thin film of silicon single crystal essentially comprising the steps of implanting boron ions in a silicon single crystal substrate from one major surface thereof to form a high impurity concentration layer having a high boron concentration in the substrate; heating the silicon single crystal substrate formed with the high impurity concentration layer in an atmosphere containing oxygen to form an oxide film on the surface of the single crystal substrate and make the high impurity concentration layer resistant to etching; masking all of the oxide film surface other than that at the center region on the surface opposite from that implanted with boron ions and then exposing the high impurity concentration layer by high-speed mask etching followed by selective etching; and removing the oxide film.

DESCRIPTION OF THE PREFERRED EMBODIMENTS

The individual processing steps of the method of the invention will be explained first.

1) Ion implantation step

Figure 1:
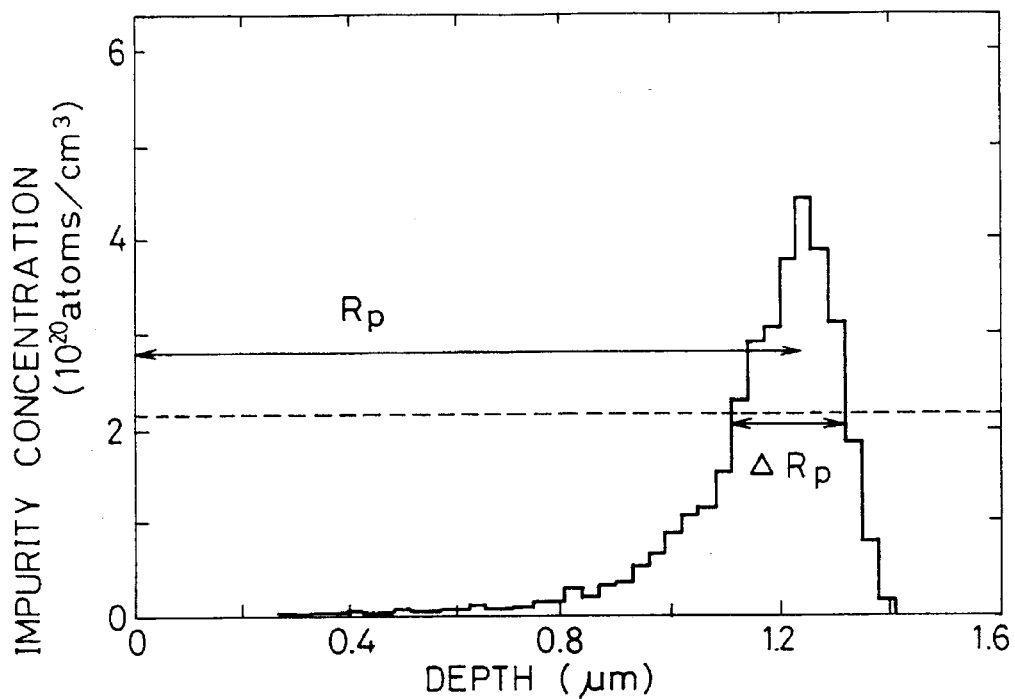
FIG. 1 is a graph showing the boron atom (impurity) concentration distribution in a silicon single crystal substrate implanted with boron ions at 0.5 MeV.

In this step several hundred to several thousand keV boron ions are implanted in the surface of a silicon single crystal substrate to form a high impurity concentration layer (layer with high boron concentration) at a depth of several µm (0.5–10 µm) from the surface. FIG. 1 shows a depth profile of the region where boron atoms are present when ion implantation is conducted in this manner. (This depth profile is that of the first embodiment of the invention explained later.)

The vertical axis of the graph is scaled for the impurity (boron) concentration and the horizontal axis for surface penetration (depth) from the implantation surface. Rp indicates the surface penetration of the maximum boron concentration region from the single crystal surface and ΔRp indicates the width (spread) of the boron layer.

As can be seen in FIG. 1, the boron atoms are present in Gaussian distribution. The depth of the boron atoms, i.e., the mean projected range thereof, is determined by the implantation energy and the center of the Gaussian distribution is the mean projected range. The distance between the boron implantation surface and the high impurity concentration layer is in the range of approximately 0.5–10 µm. As shown in FIG. 1, a boron free layer (region) is present on the surface side of the silicon single crystal substrate. Although the crystallinity of this layer incurs radiation damage owing to the passage of the implanted ions, the crystallinity can be recovered relatively easily by the heat treatment described in 2) below.

Figure 2:
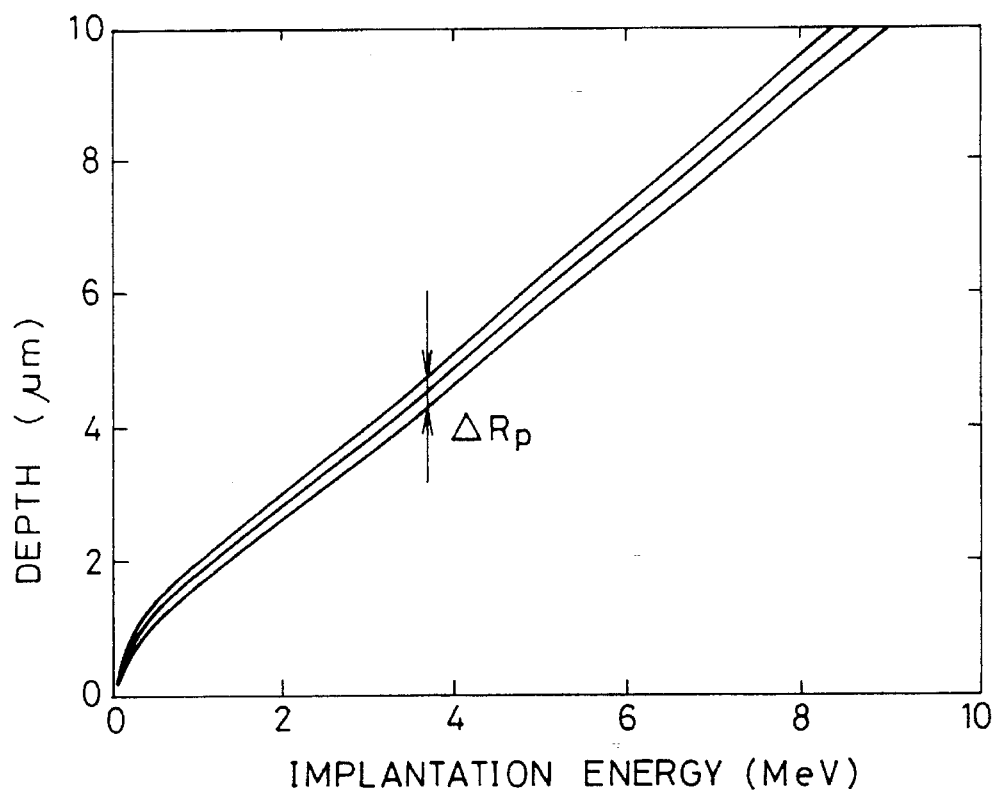
FIG. 2 is a graph showing how the thickness of a boron ion-implanted layer varies with the boron ion implantation energy.

FIG. 2 shows how ΔRp varies with the implantation energy used for implanting boron in the silicon single crystal substrate and the distance (depth) from the substrate surface of the high impurity concentration layer formed by the implantation. The vertical axis is scaled for distance (depth) and the horizontal axis for implantation energy.

2) Step of heating in oxygen-containing atmosphere

In this step the high impurity concentration layer formed in the preceding step is modified to a stable layer that remains substantially unetched during the following etching step, the crystalline damage induced by the preceding step is recoverd, and an approximately 0.1 μm oxide film is formed on the surface of the silicon single crystal substrate. If the treatment temperature is too high or if the treatment time is too long, the implanted boron ions are diffused and the maximum boron concentration of the high impurity concentration layer is reduced. If the temperature is too low or the time too short, the stabilization of the impurity layer and the restoration of the crystallinity are insufficient. Preferably, therefore, the heat treatment is conducted at a temperature of 950–1000° C. for a period of 30 min to 2 hours. The treatment has to be conducted in oxygen or air so as to form the oxide film on the surface of the silicon single crystal substrate. The thickness of the oxide film formed in this way is in the range of approximately 0.05–2 μm.

3) Etching step (including high-speed mask etching, selective etching and oxide film removal)

Three types of etching are conducted in this step: high-speed mask etching using a hydrofluoric acid-nitric acid etchant, selective etching using an ethylene diamine-pyrocatechol base alkaline etchant, and oxide film removal etching using, for example, an aqueous solution of hydrofluoric acid.

In the etching using the etchant consisting mainly of hydrofluoric acid-nitric acid, the entire surface of the silicon single crystal substrate is masked except for one part on the surface on the side opposite from the ion-implanted surface and this exposed part is etched at high speed to a thickness of about 10–15 μm.

The etching using an alkaline etchant such as ethylene diamine-pyrocatechol is conducted over all parts of the silicon single crystal substrate but the etching does not proceed at the region masked during the high-speed mask etching since it is still covered with the oxide film. Thus only the parts etched by the high-speed mask etching are selectively etched again. Since the etching speed falls sharply when the high impurity concentration layer is reached, the silicon single crystal substrate is etched into a tray-like shape with the high impurity concentration layer exposed at the bottom inside the tray.

Figure 3:
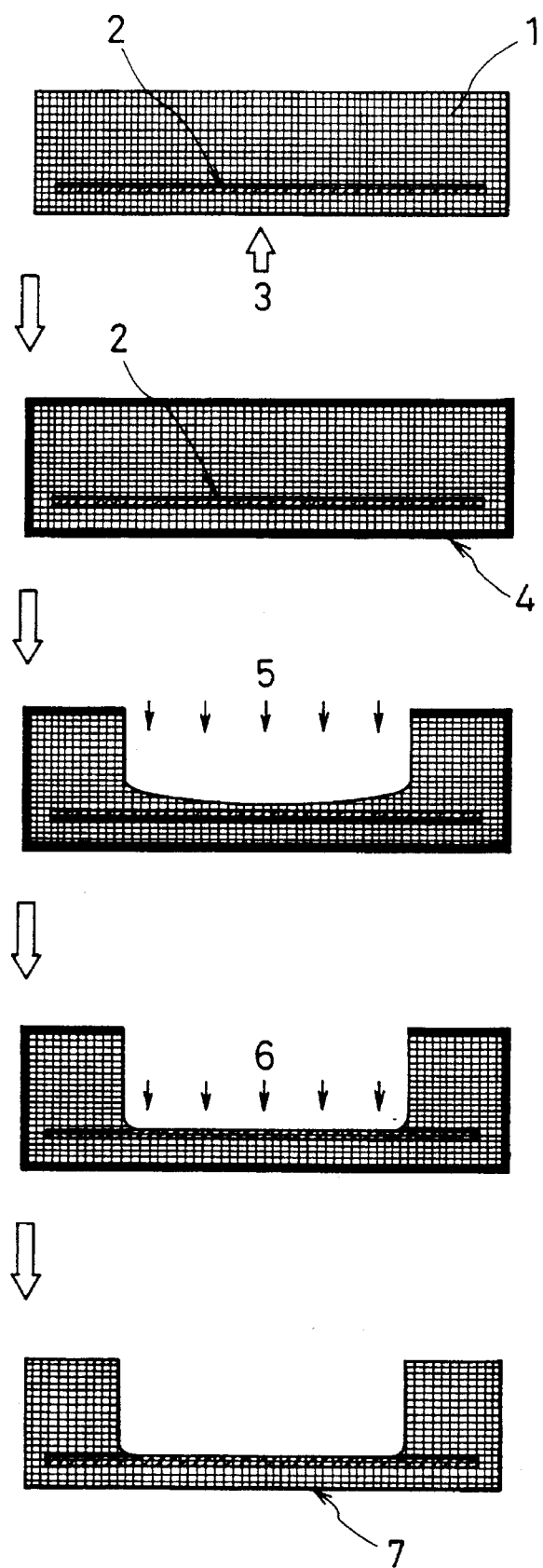
FIG. 3 is a diagram schematically illustrating the processing steps according to the invention.

The final etching with the aqueous solution of hydrofluoric acid removes the oxide film from the surface, whereby a thin layer having a uniform thickness of about 0.5–10 μm and constituting a self-supporting thin film is formed at one region of the silicon single crystal substrate. These etching steps are illustrated schematically in FIG. 3, in which reference numeral 1 designates the silicon single crystal substrate, 2 the implanted boron layer, 3 the ion implantation surface, 4 the oxide film, 5 the mask etching, 6 the selective etching and 7 the finally obtained single crystal self-supporting thin film.

The aforesaid steps form one part of a several hundred μm-thick silicon single crystal substrate into a single crystal self-supporting thin film with a uniform thickness of approximately 0.5–10 μu.

Specific working examples of the invention will now be described.

EXAMPLE 1

A generally disk-shaped silicon single crystal substrate measuring 0.2 mm in thickness and 10 mm in diameter and having its surfaces cut parallel to the (100) surface was used. One surface of the substrate was polished to a mirror finish. A high impurity concentration layer was formed in the substrate by implanting it throughout with 0.5 MeV boron ions from the side of the mirror surface at the rate of $1\times10^{16}$ ions/cm$^2$. The impurity distribution of the substrate is shown in FIG. 1.

The substrate was then heat-treated (annealed) in atmospheric air at 950° C. for 1 hr to form a 0.1 μm-thick oxide film.

After the annealing, the substrate was fastened mirror surface side down to a quartz disk using Teflon (registered trademark) adhesive tape. The rear surface (surface opposite the mirror surface) of the substrate was then masked with adhesive tape so as to leave only a region measuring 6 mm in diameter exposed at the center. Next the substrate, as still attached to the quartz disk, was immersed in etchant (hydrofluoric acid, nitric acid and glacial acetic acid, 3:5:3) for etching and reducing the thickness of only the exposed region. The etchant was kept thoroughly stirred throughout the etching operation. For determining when the etching of the exposed region had proceeded to the point of reducing the thickness to about 10 μm, a strong light beam was directed onto the bottom of the polyethylene etching vessel and the light transmitting through the substrate at the exposed region was observed. As soon as transmitted red light was observed at the etched surface after ten-plus minutes, the substrate was immediately removed from the etchant, washed with water, removed of the adhesive tape (mask), and washed in an organic solvent.

A selective etchant was then prepared by mixing 17 ml of ethylene diamine, 5 g of pyrocatechol and 8 ml of water in a glass beaker and heating the mixture to 100°–110° C. on a hot plate. The substrate was placed in the etchant and a strong beam of light was directed onto the bottom of the beaker. By observation of the transmitted light it was ascertained that the etching surface reached the high impurity concentration layer of the substrate in several to ten and several minutes. When it was found through continued observation that a layer of uniform thickness had been formed over a wide area, the substrate was removed from the etchant and thoroughly washed in high-temperature (approximately 78° C.) ethanol.

The substrate was then immersed for 5–20 min in an etchant consisting of a 10% aqueous solution of hydrofluoric acid for removing the oxide film from its surface.

Figure 4:
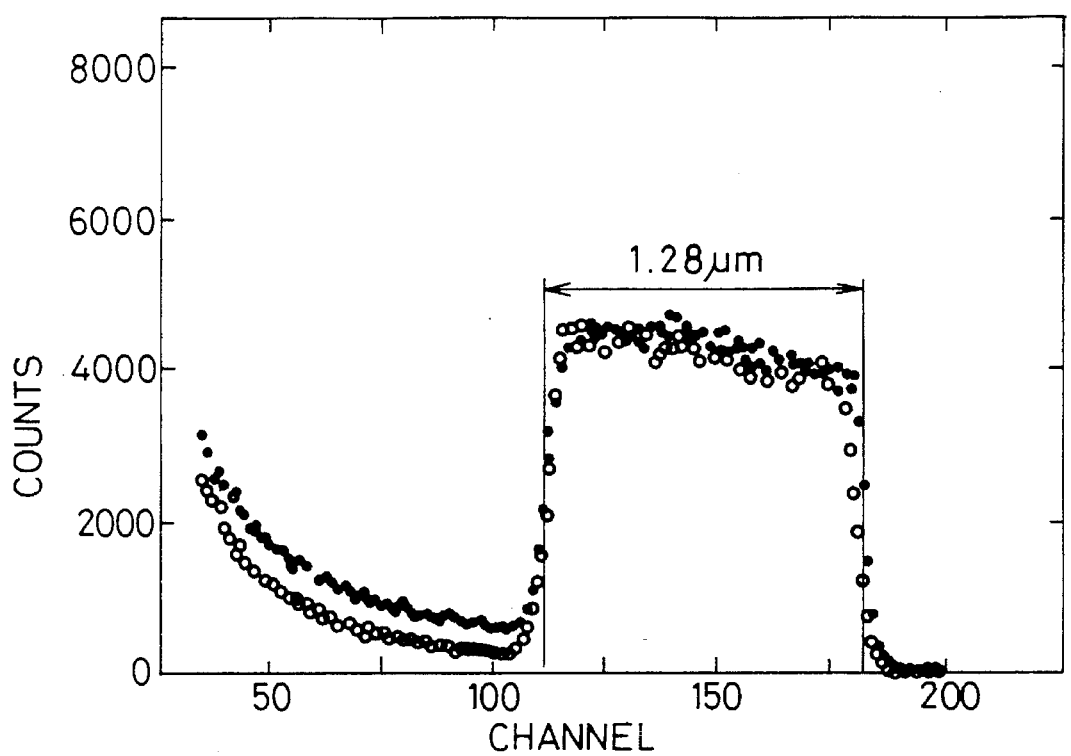
FIG. 4 is a graph showing the spectrum obtained when a single crystal self-supporting thin film produced in accordance with a first embodiment of the invention was subjected to RBS using a 2.7 MeV helium beam.

As a result of the foregoing process, there was obtained a silicon single crystal substrate formed at one part thereof with a layer of uniform thickness (the self-supporting thin film). The silicon single crystal substrate was subjected to Rutherford backscattering spectrometry (RBS) using a 2.7 MeV helium beam. The results are shown by ● in FIG. 4, wherein the vertical axis is scaled for count and the horizontal axis for channel. By analysis of the RBS spectrum, it was found that the self-supporting thin film had a thickness of 1.28 μm. This thickness corresponds to the mean projected range of 0.5 MeV boron ions in silicon shown in FIG. 2 (approximately 1.18 μm). The silicon single crystal substrate was further subjected to RBS-channeling using a 1.8

Figure 5:
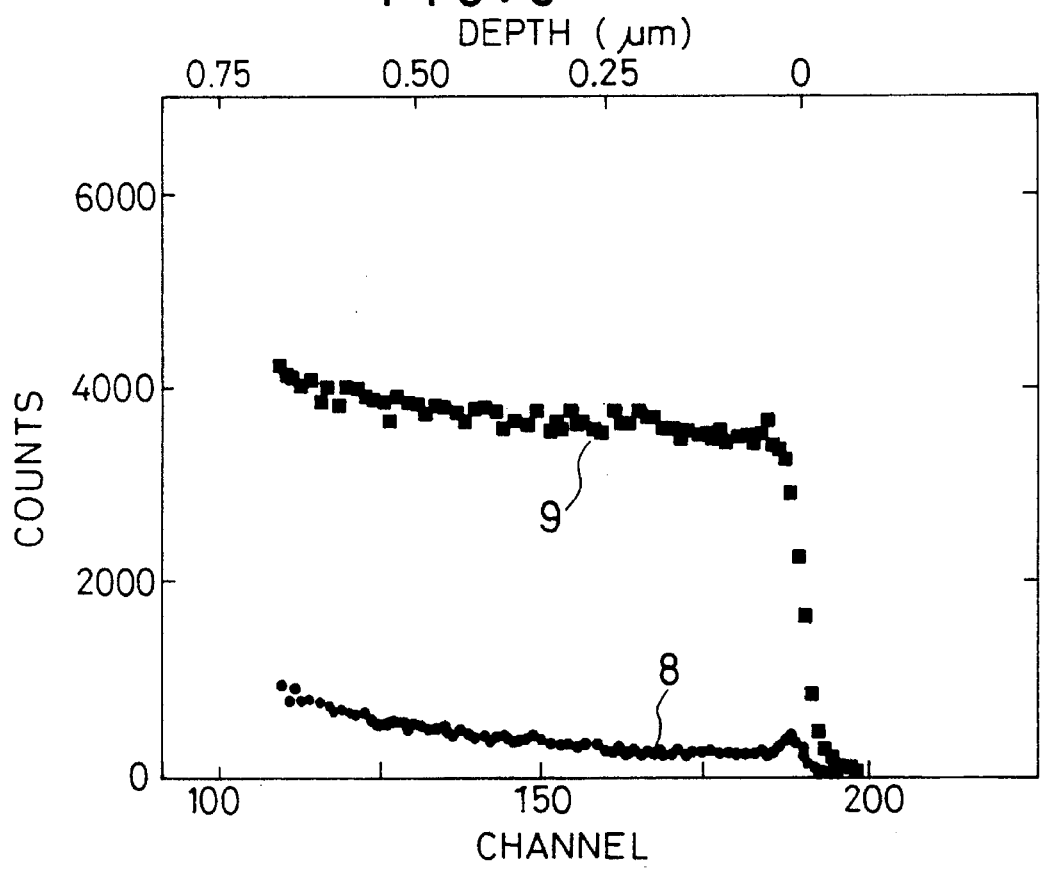
FIG. 5 is a graph showing the result obtained when the single crystal self-supporting thin film produced in accordance with a first embodiment of the invention was subjected to RBS-channeling using a 1.8 MeV helium beam.

MeV helium beam. The results are shown in FIG. 5, in which the vertical and horizontal axes are scaled in the same way as in FIG. 4 and the horizontal axis is further scaled for depth. FIG. 5 shows the RBS spectrum obtained when the helium ions were directed parallel to the crystal axis (<100> axis) of the silicon single crystal substrate (aligned spectrum indicated by reference numeral 8) and that obtained when they were directed at an angle of 5° to the crystal axis (random spectrum indicated by reference numeral 9). The aligned spectrum counts are much lower than the random spectrum counts and it was confirmed by comparison with measurement results for a thick single crystal that the formed self-supporting thin film had an almost perfect single crystal structure.

EXAMPLE 2

A silicon single crystal substrate exactly the same as that of Example 1 was processed in exactly the same way as in Example 1 to obtain a silicon single crystal substrate formed at one part thereof with a uniformly thick self-supporting film similar to that of Example 1. The results obtained when this substrate was subjected to RBS under the same conditions as in Example 1 are shown ○ in FIG. 4. As will be noted, the results in this Example were similar to those in Example 1.

The present invention has thus been shown and described with reference to specific embodiments. However, it should be noted that the present invention is in no way limited to the details of the described arrangements but changes and modifications may be made without departing from the scope of the appended claims.

The method of this invention enables a self-supporting thin film of silicon single crystal to be produced more simply than has been possible by the prior art methods. It can therefore be widely used for the production of single crystal self-supporting thin films for use in a broad range of devices including transmission type detectors for identifying high-energy ions; infrared, temperature and other types of sensors; filters and splitters for SOR; and micromachines.

We claim:

1. A method of producing a self-supporting thin film of silicon single crystal, comprising:

a) implanting boron ions in a silicon single crystal substrate from one major surface thereof to form a high impurity concentration layer having a high boron concentration in the substrate;

b) heating the silicon single crystal substrate formed with a high impurity concentration layer in an atmosphere containing oxygen at a temperature between about 950° C. to about 1,000° C. for a period of between about 30 minutes and about 2 hours, thereby avoiding diffusion of said implanted boron ions, to form an oxide film on the surface of the single crystal substrate, thereby making the high impurity concentration layer resistant to etching;

c) masking all of the oxide film surface of other than that of the center region surface opposite from that implanted with boron ions and then exposing the high impurity concentration layer by high-speed mask etching followed by selective etching; and d) removing the oxide film.

2. The method of claim 1, wherein the thickness of the self-supporting thin film of silicon single crystal form is controlled by controlling the energy of the boron ions implanted in the single silicon crystal substrate.

3. The method according to claim 1, wherein the high impurity concentration layer is located between about 0.5 $\mu$m and about 10 $\mu$m below the surface of the silicon single crystal substrate from which the boron ions are implanted.

4. The method according to claim 1, wherein the oxide film formed on the surface of the silicon single crystal substrate has a thickness of between about 0.05 $\mu$m and about 2 $\mu$m.

5. The method of claim 1, wherein the high-speed mask etching is conducted with an etchant consisting mainly of hydrofluoric acid and nitric acid.

6. The method of claim 5, wherein the oxide film is removed by etching with hydrofluoric acid.

7. The method of claim 1, wherein the selective etching is conducted using an alkaline etching.

8. The method of claim 7, wherein the alkaline etchant consists of ethylene diamine and pyrocatechol.

9. The method according to claim 1, wherein in step a), said boron ions have an energy of from about several hundred to several thousand KeV and are implanted to form said high impurity concentration layer at a depth of about 0.5 to 10 $\mu$m from the surface.

10. The method according to claim 1, wherein in step b), said oxide film formed has a thickness of about 0.05 to 2 $\mu$m.

* * * * *